United States Patent [19]
Whitson et al.

[11] Patent Number: 5,400,217
[45] Date of Patent: Mar. 21, 1995

[54] AVIONIC INSTRUMENT TRAY COOLING SYSTEM

[75] Inventors: Frederick A. Whitson, Oconomowoc; Carlos Assef, Oak Creek, both of Wis.

[73] Assignee: Electronic Cable Specialists, Franklin, Wis.

[21] Appl. No.: 126,053

[22] Filed: Sep. 23, 1993

[51] Int. Cl.⁶ .............................................. H05K 7/20
[52] U.S. Cl. ................................. 361/695; 454/184; 244/1 R
[58] Field of Search .............................. 165/80.2, 121; 415/182.1; 454/184; 244/1 R; 361/695

[56] References Cited

U.S. PATENT DOCUMENTS

| | | | |
|---|---|---|---|
| 1,966,787 | 7/1934 | Buri | 415/182.1 X |
| 5,000,079 | 3/1991 | Mandis | 454/184 |
| 5,170,320 | 12/1992 | Pease | 361/694 X |

*Primary Examiner*—John C. Fox
*Attorney, Agent, or Firm*—Ryan, Kees & Hohenfeldt

[57] ABSTRACT

An avionic tray has a base plate for supporting a line replaceable unit (LRU) and a plenum beneath and substantially coextensive in length with the base plate to provide for discharge of coolant air from the plenum into the LRU. The base plate has an opening leading to the plenum and the cylindrical casing of a motor driven fan is coupled to the base over the hole for air from the fan to be discharged into the plenum. The outlet end of a ram tube is coupled coaxially with the fan casing to increase the volume that would be delivered without the ram tube. The inlet end of the ram tube is preferably cut at an angle relative to a plane to which the axis of the tube is perpendicular so the inlet is elliptical rather than circular. The fan is mounted to a special transition adapter in some cases. The adapter is configured to provide a clearance space for cables that run out of the rear side of a connector block on whose front side connector prongs on the LRU are inserted. The input opening of the adapter is circular and its output opening is rectangular. Both openings have the same cross-sectional area.

21 Claims, 4 Drawing Sheets

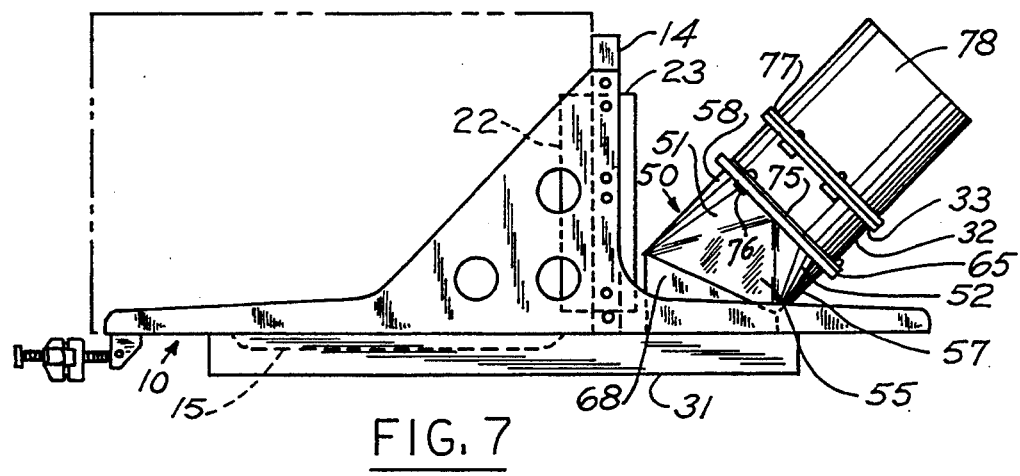
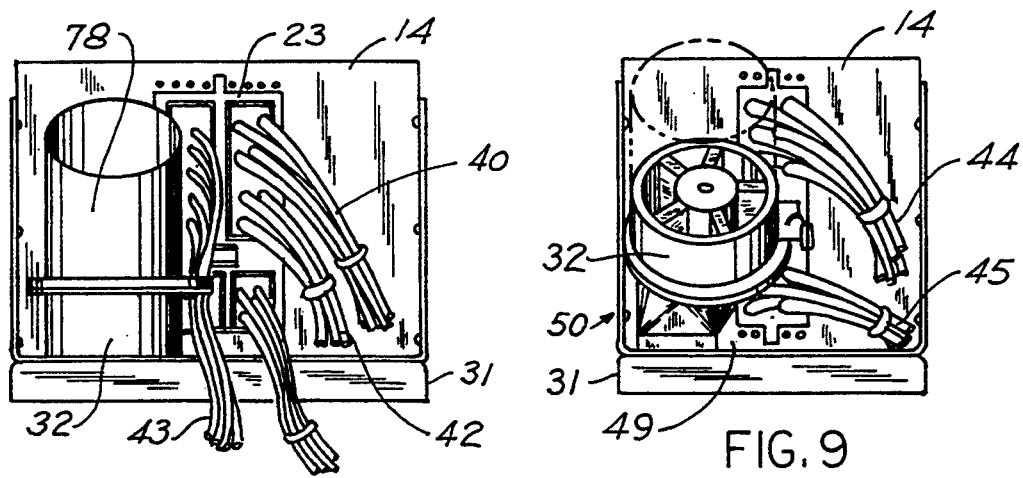
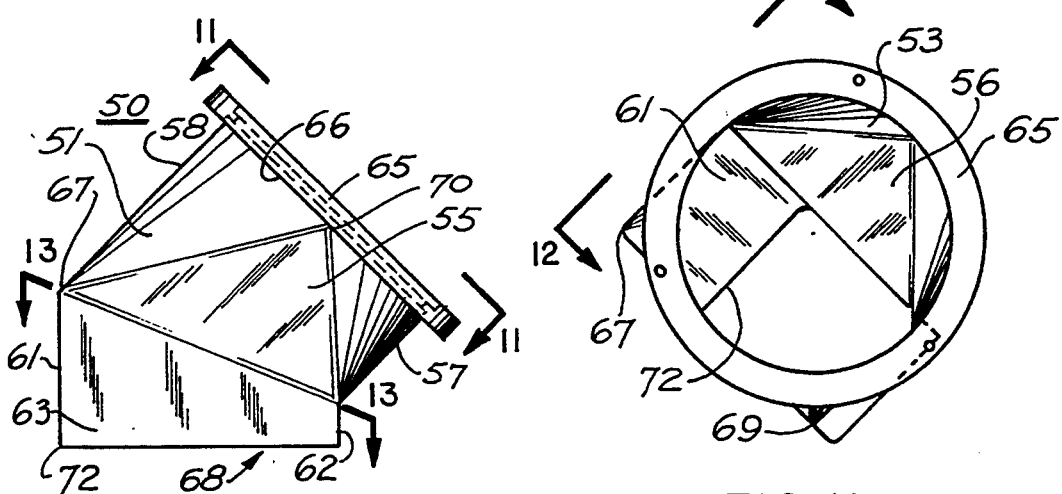

AVIONIC INSTRUMENT TRAY COOLING SYSTEM

BACKGROUND OF THE INVENTION

The invention disclosed herein pertains to enhancing the flow of coolant air through the plenum of an avionic tray and a line replaceable unit that is mounted to the tray.

In aircraft, electronic and electrical circuitry is contained in line replaceable units (LRUs), which are essentially metal boxes having air inlet and air outlet holes on their bottom and top surfaces, respectively. The LRUs are inserted in trays whose dimensions and configurations are standardized in accordance with the requirements of the avionic and aerospace industries. A multiple circuit electrical connector is typically mounted in an upstanding wall in the rear part of the tray, and mating electrical connectors are mounted on the rear of the LRU box, so that when the LRU is slid into the tray, the mating connectors join and a plurality of electrical circuits are completed. Generally, an assortment of cables run out of the back of the connectors to other locations in the aircraft. The bottom, or base, of the tray has a plenum chamber beneath it and a recess whose margins are surrounded by a gasket. There is a so-called metering plate in the bottom of the recess. The metering plate has a plurality of holes, some of which may be plugged, so that the quantity of air flowing outwardly from the plenum is suitable for the size of the LRU box and for the heat from the electronic components in the LRU, which must be dissipated by way of coolant air flowing through the LRU. The LRU bottom surface has a plurality of air inlet holes and its top surface has a plurality of air outlet holes. Provision is made for mounting a fan on the tray. The fan draws air from the atmosphere within the aircraft and discharges the air into the plenum. After passing through the holes in the metering plate, the air enters the LRU through its bottom holes, and, after absorbing heat from the electronic components within the LRU box, the air discharges through the holes in the top of the LRU box. Factors which must be considered in connection with designing the coolant system for LRUs are the space on the tray that is available for mounting the fan, fan size, fan speed and fan efficiency. Together, these factors must be chosen so that the system will provide the LRU with adequate coolant air to carry away the substantial amount of heat that is produced by the electronic components in the LRU. Maximizing the plenum fan diameter or size is likely to be governed by the space available for the fan. Heretofore, fulfillment of the coolant air quantity requirement was still only marginal in many cases even though the largest permissible diameter fan having the highest speed and highest efficiency was selected. In some cases fans having extremely high rotational speeds emitted a shrill, annoying noise. Moreover, as fan speeds go up, fan motor life shortens. These, and other considerations, raise a challenge as to what can be done to meet air flow requirements when the largest, highest speed and most efficient fan that is available is insufficient or leaves an unacceptably low margin of thermal safety.

Another consideration is that there are usually several stiff electrical cables running from the electrical connector on the rear wall of the avionic tray. These cables necessarily run through space that is shared with the coolant air fan and its mounting. Hence, the size and configuration of the fan mounting or, in other words, the size and configuration of the adapter that makes the transition between the fan and the plenum of the tray ought to be optimized.

SUMMARY OF THE INVENTION

In accordance with the invention, the fan efficiency and the coolant air flow volume is maximized for a given fan speed and size by providing the fan inlet with a ram tube.

Another feature of the invention is to couple the outlet of the fan to the plenum of the avionic tray by means of a transition coupling on whose inlet the circular outlet of the fan is mounted, and that converges to a rectangular opening where the connection is made to the plenum, the transition coupling being characterized by having a circular inlet and a rectangular outlet opening which have equal cross-sectional areas to provide for avoiding any change in the velocity head, or pressure, between the fan and plenum of the avionic tray.

By way of example and not limitation, the benefit of using a ram tube is manifested in a practical situation wherein, to meet fan delivery requirements using traditional concepts, a fan of a particular diameter and efficiency had to be operated at 20,000 rpm to obtain the requisite air flow quantity. When the ram tube was adopted in accordance with the invention, a fan of the same diameter and turning at only 6,500 rpm resulted in delivering the same volume of air as the higher speed fan. The high speed fan emitted a shrill high frequency noise, whereas the substitute, lower-speed fan operates without perceptible noise and is expected to have a life that is more than inversely proportional to the reduction in fan speed.

Although the aerodynamic phenomena involved in using the ram tube is complex, it is known that the ram tube causes a negative pressure to be developed close to the inlet opening of the fan. This negative pressure increases the differential between it and the atmospheric pressure at the inlet of the ram tube such that the air flow in the tube relative to the fan inlet is increased and, as a consequence, the total coolant air flow is increased. It has been discovered, too, that installation of the ram tube on a fan that was previously operating without one resulted in increased fan output and, at the same time, a reduction in the amount of current drawn by the fan motor.

The advantage of using ram tubes has been demonstrated by the racing car engine designers. They use ram tubes to enhance air flow in such a manner as to achieve certain engine operating characteristics such as preferential increase in torque, or engine speed. In engine practice, various performance characteristics are obtained by using cylindrical ram tubes of different lengths. The ends of the tubes are square or, in other words, they lay on a plane that is perpendicular to the axis of the tube. In accordance with the invention, the ram tubes are angulated at the air input end. That is, they are cut such that the end lies on a plane that is transverse to the axis of the tube and at an angle relative to the axis. Thus, the air inlet opening end of the ram tube is elliptical.

In a further implementation of the inventive concept, the air discharge outlet of the fan is coupled to the plenum of the LRU tray by means of an angulated transition adapter that has a circular inlet opening to which the outlet of the fan is coupled and a rectangular or square outlet coupled to the plenum. The areas of the circular inlet to the fitting and its rectangular outlet are equal.

How the general objectives and features set forth above and more specific objectives and features of the invention are achieved and implemented will be evident in the ensuing more detailed description of the invention, which will now be set forth in reference to the drawings.

DESCRIPTION OF THE DRAWINGS

FIG. 7 is a side elevational view of a fan mounted on the new constant air velocity adapter wherein a ram tube that is coupled to the fan inlet;

FIG. 8 is a rear elevational view of an avionic tray with a fan and a ram tube on the fan showing how the cables leading to the connector at the rear of the avionic tray must share the space with the fan;

FIG. 9 is a rear elevational view of an avionic tray with cables emerging from the connector at the back of the tray and a lower bundle of stiff cables that would ordinarily be interfered with by the coupling or duct between the fan and the plenum, now being able to pass without interference because of the converging configuration of the new constant velocity transition adapter;

FIG. 10 is a side elevational view of the constant velocity transition adapter;

FIG. 11 is a view looking into the inlet end of the adapter on which the fan body flanges would ordinarily be mounted as viewed in the direction of the arrows 11—11 in FIG. 10;

DESCRIPTION OF A PREFERRED EMBODIMENT

Figure 1:
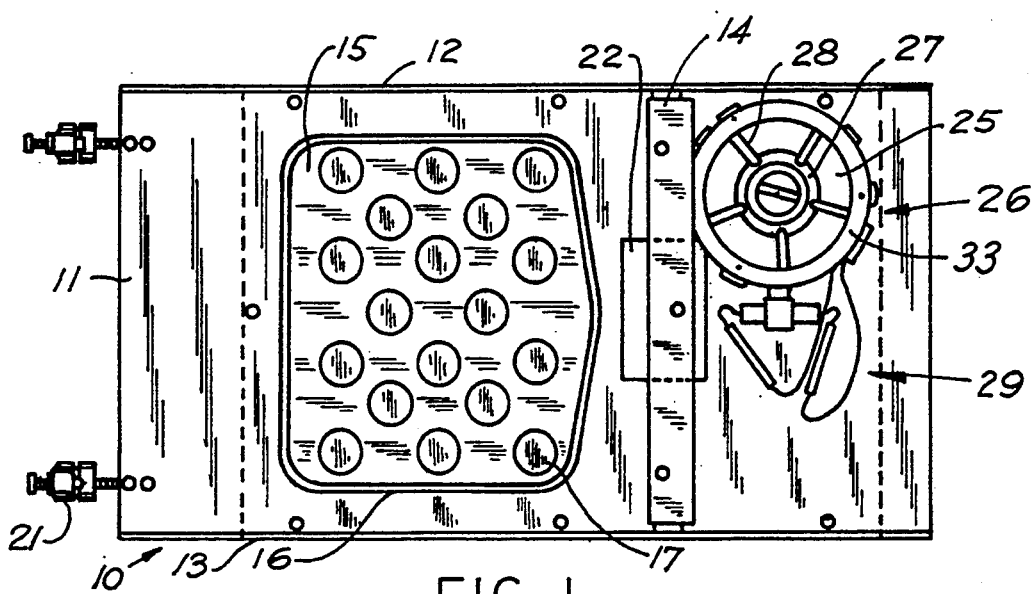
FIG. 1 is a top plan view of an avionic tray looking down at the multiple hole metering plate and looking down at the inlet of the circular fan body.

Attention is invited to FIG. 1 which is a top plan view of an illustrative avionic tray 10 on which an LRU box is not mounted as yet. The tray comprises a flat base plate portion 11 that has upstanding sides 12 and 13 and a vertical rear wall member 14. As is characteristic of this kind of tray, the base plate 11 has a depression, or recess, in whose bottom there is a metering plate 15. The margin of the recess is provided with a gasket 16 that extends about its perimeter. Metering plate 15 has a plurality of holes such as the one marked 17. In most cases, some of the holes 17 are closed with rubber plugs so the holes that remain open are sufficient in total cross-sectional area to provide for adequate coolant air flow through an LRU box that is set on the base plate 11 over the metering plate 15 to which it is sealed by the gasket 16.

Figure 2:
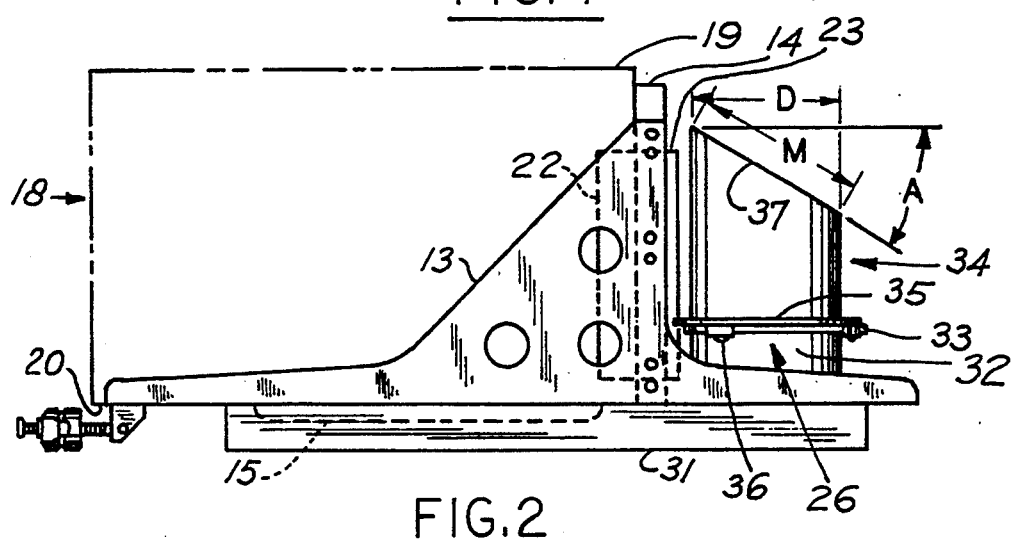
FIG. 2 is a side elevational view of the avionic tray wherein the line replaceable unit (LRU) and the electrical connector block is represented by dashed line rectangles and wherein the fan inlet has an angular cut ram tube coupled to it in accordance with the invention.

FIG. 2 symbolizes an LRU with a dashed line rectangle marked 18. LRU 18 is basically a metal box that contains electronic circuit components, not visible, such as transistors, circuit boards and the like. It is these components that produce the heat which must be dissipated by forcing a stream of coolant air through the LRU. Hence, the top surface 19, which is usually flat, is provided with a mosaic of small air outlet holes which would be visible if one looked downwardly on the box. The bottom surface 20 of the LRU 18 is also provided with a mosaic of holes, not visible, which are superposed over the metering plate 15 when the LRU box is mounted to the avionic tray. Hold down clamps 21 are provided for securing LRU 18 in the tray. As shown in dashed lines in FIG. 2, the rear end of LRU 18 has an electrical connector block 22 mounted in it. The rear wall 14 of the tray has a multiple pin connector block mounted in it. Thus, connector block 22 in the LRU has pins, not visible, which mate with the connector block 23 mounted in the wall 14 to complete electric circuits involved in functions of the aircraft.

With attention focused on FIG. 1, one may see the circular top air inlet opening 25 of a fan that is generally designated by the numeral 26. The fan blades are not depicted, but the motor 27 for driving the fan blades is shown to be mounted on radially inwardly extending struts 28. Wiring for supplying electric power to the fan is illustrated schematically and marked 29.

A side view of the plenum 31 mounted to the bottom of the tray is shown in FIG. 2. As is suggested by the dashed line, the metering plate 15 recesses into the plenum and provides for conducting an air stream through the LRU 18.

FIG. 2 shows a side elevational view of the fan 26. The body or casing 32 of the fan is cylindrical. The cylindrical body terminates at its upper edge in a flange 33. In accordance with the invention, a ram tube 34 is mounted to the fan. The ram tube has, at its lower edge, a flange 35 which mates with the flange 33 of the cylindrical fan body 32. The two flanges are held together by means of screw-down tabs such as the one marked 36. The wall thickness of the ram tube 34 may be on the order of 2 mm, by way of example and not limitation. The ram tube 34 in FIG. 2 has its upper end angulated as shown. The angle A is measured relative to a transverse plane to which the axis of ram tube 34 is perpendicular. As a result of the angular cut, the air inlet opening 37 of the ram tube is elliptical in shape. The major axis of the ellipse is designated "M". The cutting angle is "A". The inside diameter of the ram tube is "D". The area of the tube bore is Ta. The minor axis of the ellipse is designated "B".

It is known that $M = D/\cos A$. thus, by way of example, where the ram tube has an inside diameter of 3 inches (76.2 mm), the cutting angle A is 30 degrees, and $\cos 30 = 0.866$, the major axis M of the ellipse is calculated by: M=D/Cos A=3/0.866=3.46 inches (87.9 mm).

The area E of the ellipse is calculated by the well known equation E=π·M/2·d/2. For the illustrative 3 inch (76.2 mm) tube: E=·3.46/2·3/2=8.16 in$^2$(207.1 mm$^2$).

Experience has shown that the benefit of increased air inflow and output of the fan can be obtained when the cut angle A is as small as zero and as large as 45 degrees and possibly even more, When the cut angle A is small, approximating zero degrees, the air flow is not as pronounced as at higher values of the angle A. The preferred angle A appears to fall in the range of 30 degrees to about 45 degrees.

As a practical matter, the diameter of the ram tube that is chosen will be governed by the diameter of the circular fan housing. This, in turn, may be governed by how much space is available on the LRU tray. Also, the axial length of the ram tube may depend on how much clearance space is available above the eight of the LRU tray. Regardless of design restraints, tests have shown that a substantial increase in fan output can be obtained by installing a ram tube on the housing of the fan. Optimizing the specifications for the ram tube can be easily achieved by cutting sample tubes at increasingly larger angles A. (In any case, the beneficial phenomena of having a low pressure region occur somewhat above the input opening of the fan such that the pressure differential between the input and the ambient about the tube will result in a larger air flow.) Designing based on the complex theory of air flow in a ram tube and fan combination can be avoided by using this empirical method. It seem that maximizing air flow with a selected fan is also governed to some extent by the height of the lower end of the elliptical inlet to the ram tube measured from the bottom end of the tube as indicated by the letter B in FIG. 3.

Figure 3:
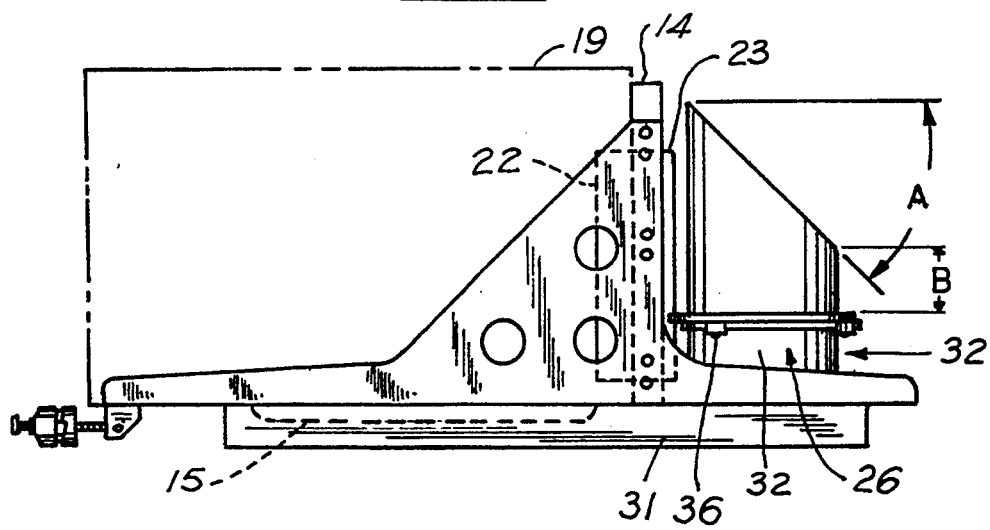
FIG. 3 is a side elevational view similar to the preceding FIG. 2 except that the inlet end of the ram tube is cut at an angle that is greater than the angle at which the tube is cut in the preceding FIG. 2.

FIG. 3 is provided to show a case where the angle A of the ram tube is about 45° or a little more. In FIG. 3, all other components are the same as those in FIG. 2 and, therefore, are given the same reference numerals.

Figure 4:
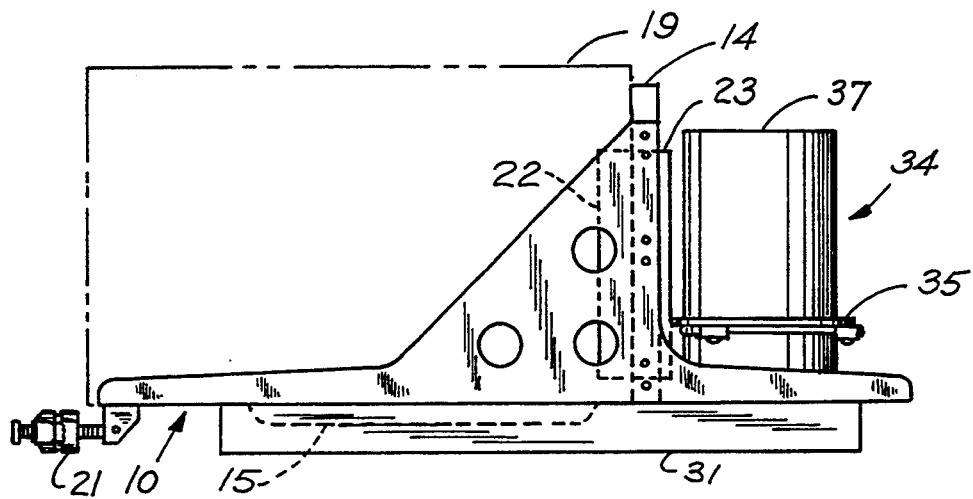
FIG. 4 is a side elevational view of the avionic tray similar to the preceding two FIGURES, except that the ram tube that is coupled to the inlet of the fan is cut transversely at opposite ends relative to the axis of the tube and in perpendicularity to the axis.

The FIG. 4 embodiment shows a ram tube 34 whose air inlet end 37 constitutes a cut through a plane to which the axis of the tube is perpendicular. In other words, the inlet end of the ram tube is not cut at an angle relative to the axis of the tube so the inlet is circular rather than elliptical. As explained, even this version of the ram tube produces some beneficial increase in air flow through the fan.

In some cases, a large fan may be required to adequately cool the electronics in an LRU. This can result in the fan interfering with routing the stiff cables that come out of the tray connectors. According to the invention, for those situations, a transition adapter is provided. Before describing the adapter, the problem of cable routing will be discussed in reference to FIGS. 8 and 9 to which attention is now invited. FIG. 8 shows an LRU tray which is basically similar to the trays discussed in connection with FIGS. 1-4. As was mentioned in connection with the earlier FIGURES, there is a connector block 23 mounted to the upright rear panel 14 of the LRU tray. FIG. 8 shows various bundles 40, 41, 42 and 43 of stiff cables that extend out of the front of the connector block 23 and must be routed past the fan body 32 and the ram tube 34. As shown in FIG. 9, even where no ram tube is mounted to the fan body 32, the fan, itself, can present substantial interference to routing of the cables which in this FIGURE are marked 44 and 45. In FIG. 9, the problem is mitigated by mounting the fan 32 on the new transition adapter which is given the reference numeral 50. Note, in FIG. 9 that the transition adapter 50 is configured such that it provides a free space in the region marked 49 which facilitates routing the cables out with a minimum of interference.

Figure 13:
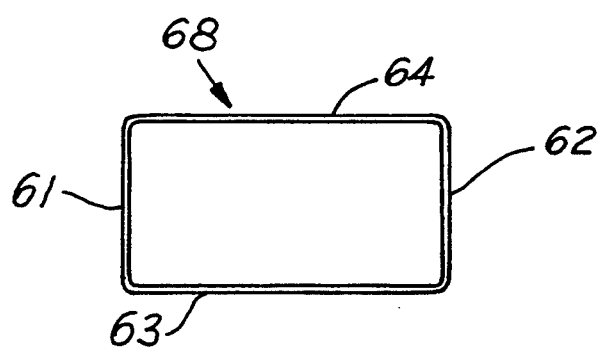
FIG. 13 depicts the rectangular air outlet opening of the transition adapter shown in FIGS. 10-12.

A side elevational or profile view of the transition adapter is presented in FIG. 10. The transition adapter is distinguished by maintaining a constant inside cross-sectional air flow area between the outlet of the fan that mounts on flange 65 of the adapter and the inlet to the plenum 31. Having the cross-sectional flow area of the adapter constant from the circular inlet opening of the adapter defined by flange 65 to the rectangular output section 68 of the adapter minimizes flow impedance and avoids the undesirable velocity pressure change and energy loss between the outlet of the fan and the inlet to the plenum 31. To understand the configuration of the transition adapter 50, it is necessary to consider FIGS. 5-7, 9 and 11-13 as well as FIG. 10. In FIG. 10 and in the other FIGURES just mentioned, one may see that the converging transition section formed in a single piece or shell that is composed of four curved and tapered corner sections 51, 52, 53 and 54 and four planar panels 55, 56, 57 and 58. All of the corner sections have some common characteristics. Consider corner section 51 in FIG. 10, for example. The upper edge 66 of corner section 51 is circular and has the same radius of curvature as the flange 65 to which it is welded. It will be understood, of course, that all of the sections of the transition portion of the adapter are formed in one piece, but the rectangular base shown in FIG. 13 is separate and is welded to the transition section of the adapter 15. The corner section 51 tapers or gets smaller and smaller as it descends to the line of intersection 67 at the back of the rectangular box-like section 68. The curved section 51 actually terminates along a line extending perpendicular to the drawing behind the point where the lead line of reference numeral 67 is applied. This point can be considered to be a line that is perpendicular to the drawing sheet in FIG. 10 and constitutes the upper edge of the wall 66 of the oblong box-like section 68 with which the tapered transition section junctions. Between any two curved corner sections such as corner sections 51 and 52, there is a planar panel section such as the one marked 55 in FIG. 10. Planar panel section 55 originates at an upper point marked 70 and diverges until it acquires the length of the line 71 where it junctions with the wall 63 of rectangular base section 68. One may see in FIG. 11, additionally, looking inside of the adapter, that opposite side curved corner sections 53 and 54 have a planar triangular panel section 56 between them. If an observer were looking along a line lying on the drawing sheet containing FIG. 10, that is, looking at the front end of the transition section and, particularly, at the planar wall section, the observer would see that the transition section with its four curved corners is not directly in line with or symmetrical to the top of the rectangular base section 63 but, would be canted or tilted to the left on the base portion 63. The base portion and upper transition section are welded together. It is this tilt that provides the additional clearance space 45 for cable 45, for example, that was mentioned earlier in reference to FIG. 9. The tilting is quite evident in FIG. 6 and, particularly, in FIG. 11. The line 72 in FIG. 11 corresponds to a line which is perpendicular to the plane of the paper in FIG.

10 and constitutes the lower rear edge of the rectangular base 68. Thus, the four corner sections 51-54 which make a transition from a circular sector to a point and the four planar panel sections 55, 56, 57 and 58 are formed together to provide the transition section of the adapter.

Figure 5:
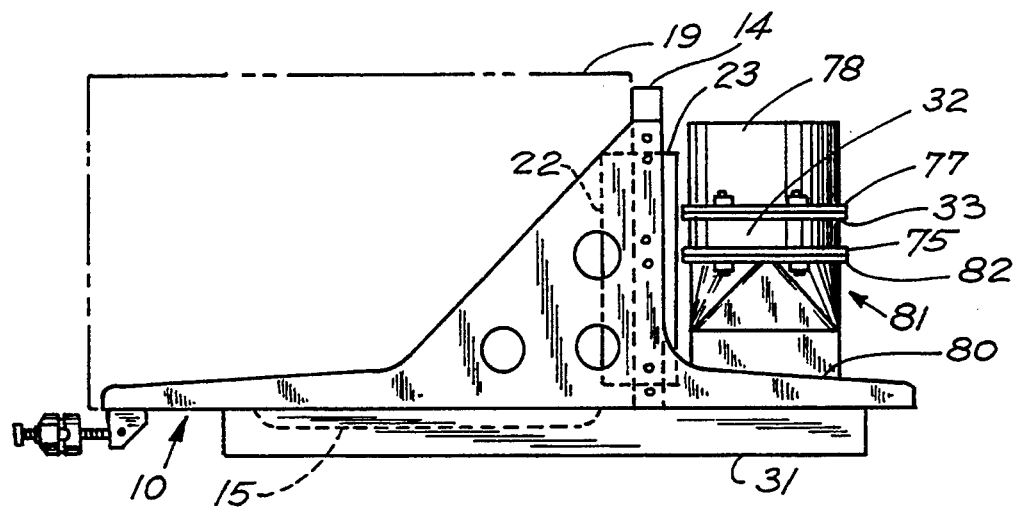
FIG. 5 is a side elevational view of an avionic tray wherein the ram tube is coupled to the inlet of the fan and the circular outlet of the fan is coupled to a rectangular opening of the tray plenum by means of a straight version of the new constant air velocity transition adapter.
Figure 6:
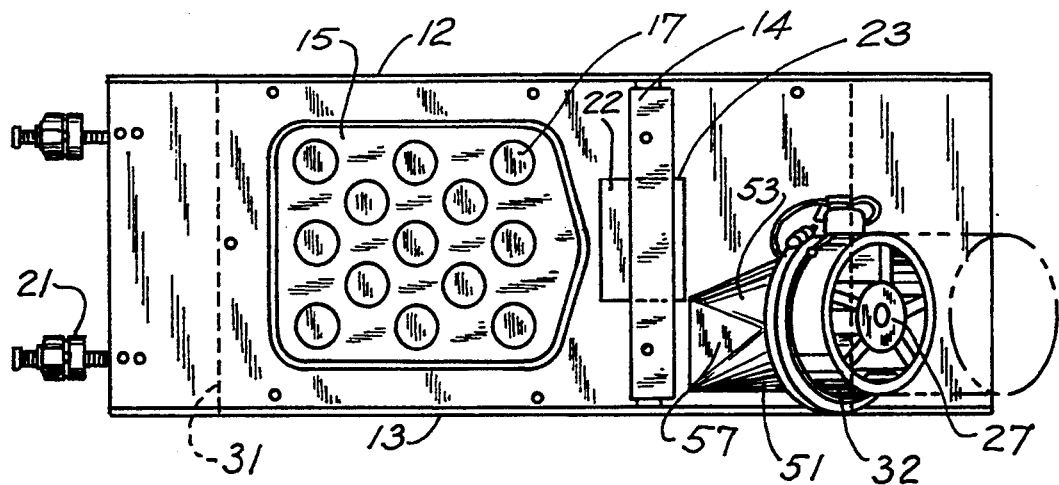
FIG. 6 is a top plan view of the fan mounted on an angulated version of the new constant velocity transition adapter.
Figure 12:
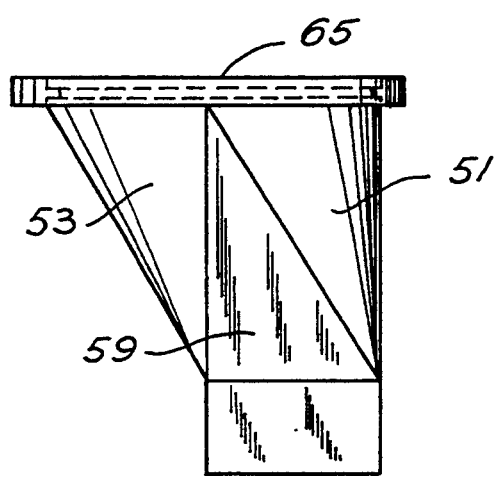
FIG. 12 is a side elevational view of the adapter taken in the direction of the arrows 12—12 in FIG. 11.

FIG. 7 shows one application of the transition adapter 50 wherein the oblong base 68 is rectangular and is fastened to the tray plenum 31 for delivering air from the fan to the plenum 31. The one side of the transition section appears to reveal two corner sections 51 and 52 with planar section 55 between them. In FIG. 7, the cylindrical fan body is marked 32 as it has been in other FIGURES and it is shown to have a bottom flange 75 which clamps to the adapter flange 65 by means of lugs such as the one marked 76. The fan body 32 also has an upper flange 33, previously mentioned, which clamps onto the flange 77 of a ram tube 78. Clamping is achieved with some lugs such as the one marked 79. The adapter need not necessarily have the transition section tilted relative to the base section. Clearance can be obtained for cables around the transition and base section where those two sections are symmetrical to each other. FIG. 5 is an example. In this adapter, the oblong base section is designated generally by the numeral 80 and the transition section of the adapter is designated generally by the numeral 81. In this case, as in the others, the transition section has a circular flange 82 at its upper end which is substantially congruent to the lower flange 75 on the fan body 32. Flanges 75 and 82 are clamped together by any suitable means. The fan body 32 also has an upper flange 33 which meets with the flange 77 at the lower end of ram tube 78. Simply because the transition section of the adapter taper downwardly, more space for running cables becomes available to the side of the transition section and to the side of the rectangular section.

Although embodiments of the avionic tray that improve cooling air flow by using a ram tube and a ram tube in combination with a transition adapter have been described in considerable detail, such description is intended to be illustrative rather than limiting, for the invention may be variously embodied and is to be limited in scope only by interpretation of the claims which follow.

We claim:

1. A device including an avionic tray and a fan assembly, the tray comprising a base surface for supporting a container for electronic equipment, the container having outlet holes for exhausting air and having a bottom in which there is at least one inlet hole, a plenum arranged beneath the base surface of the tray, the plenum having at least one hole for conducting air from the plenum to said inlet hole of the container supported on said base surface, the fan assembly comprising a casing having an outlet for coolant air in communication with said plenum and having an inlet, the casing containing a fan and a motor supported in the casing for driving the fan rotationally, and a ram tube having an outlet end coupled to said inlet of the casing and an inlet end for intake of air.

2. The device according to claim 1 wherein the ram tube is a cylinder and the inlet to said casing is circular to provide for the cylinder and casing to be coaxial, said inlet end of the ram tube terminating in a plane that is transverse to the tube and axis thereof and to which the axis of the tube is perpendicular such that said inlet end is circular.

3. The device according to claim 1 wherein the ram tube is a cylinder and the inlet to said casing is circular to provide for the cylinder and casing to be coaxial, said inlet end of said ram tube is defined by a cutting plane at an angle relative to a plane that is transverse to said tube and to which the axis of the tube is perpendicular.

4. The device according to claim 3 wherein the value of the angle is 0°.

5. The device according to claim 3 wherein the value of the angle is about 30°.

6. The device according to claim 3 wherein the value of the angle is about 45°.

7. The device according to claim 3 wherein said angle is between 0° and up to 30°.

8. The device according to claim 3 wherein said angle is at least 45°.

9. The device according to claim 3 wherein said angle is between and includes 30° and 45°.

10. A device including an avionic tray and wall members defining a plenum joined to the tray, the plenum having at least one air outlet opening for discharging coolant air and an air inlet opening, a cylindrical fan casing having an outlet end opening in communication with the plenum inlet opening and having an inlet end opening, and a cylindrical ram tube having inlet and outlet end openings, the outlet end opening coupled coaxially to the inlet end opening of said fan casing and a motor driven fan in said casing operative to draw air in through the ram tube and propel air into the inlet opening of the plenum.

11. The device according to claim 10 wherein said inlet end opening of the ram tube terminates in a plane that is transverse to the tube and the axis thereof and the axis of the ram tube is perpendicular to the plane.

12. The device according to claim 10 wherein said inlet end opening of the ram tube is elliptical and defined by a cutting plane at an angle relative to a plane that is transverse to said tube and to which the axis the axis of the tube is perpendicular.

13. The device according to claim 12 wherein the value of the angle is 0°.

14. The device according to claim 12 wherein the value of the angle is about 30°.

15. The device according to claim 12 wherein the value of the angle is about 45°.

16. The device according to claim 12 wherein the value of said angle is between 0° and 30°.

17. The angle according to claim 12 wherein the value of said angle is at least 45°.

18. The device according to claim 12 wherein said angle is between and includes 30 and 45 degrees.

19. The device according to any one of claims 1 or 10 wherein said outlet of the fan casing is circular and communicates with said plenum through a transition adapter interposed between the outlet and plenum, said adapter comprising a hollow shell having a circular inlet opening connected coaxially with the circular outlet of the fan casing and having an oblong outlet opening for communicating with the plenum, the areas of the circular outlet of the fan casing and the oblong outlet of the shell being equal.

20. The device according to claim 19 wherein the areas of cross sections of the shell between its circular inlet opening and its oblong outlet are uniform and equal to said areas of its circular inlet opening and its oblong outlet opening.

21. The device according to claim 20 wherein said oblong outlet opening is rectangular.

* * * * *